United States Patent
Verbeure

(10) Patent No.: US 9,563,227 B2
(45) Date of Patent: Feb. 7, 2017

(54) APPROACH TO CLOCK FREQUENCY MODULATION OF A FIXED FREQUENCY CLOCK SOURCE

(71) Applicant: NVIDIA CORPORATION, Santa Clara, CA (US)

(72) Inventor: Tom J. Verbeure, Sunnyvale, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 506 days.

(21) Appl. No.: 13/761,027

(22) Filed: Feb. 6, 2013

(65) Prior Publication Data

US 2014/0223221 A1    Aug. 7, 2014

(51) Int. Cl.
*G06F 1/08* (2006.01)
*H03L 7/097* (2006.01)

(52) U.S. Cl.
CPC ............... *G06F 1/08* (2013.01); *H03L 7/097* (2013.01)

(58) Field of Classification Search
CPC ............... G06F 1/00; G06F 1/04; G06F 1/12; G06F 1/26; G06F 1/32; G06F 11/30; G06F 15/16
See application file for complete search history.

(56) References Cited

U.S. PATENT DOCUMENTS

| | | | |
|---|---|---|---|
| 4,677,648 A | 6/1987 | Zurfluh | |
| 4,791,488 A | 12/1988 | Fukazawa et al. | |
| 5,245,637 A | 9/1993 | Gersbach et al. | |
| 5,945,862 A | 8/1999 | Donnelly et al. | |
| 5,970,110 A * | 10/1999 | Li | G06F 7/68 327/115 |
| 6,329,850 B1 * | 12/2001 | Mair et al. | 327/107 |
| 6,348,823 B1 * | 2/2002 | Pan | H03L 7/089 327/149 |
| 7,069,458 B1 * | 6/2006 | Sardi et al. | 713/401 |

(Continued)

FOREIGN PATENT DOCUMENTS

| | | |
|---|---|---|
| TW | I314256 B | 9/2009 |
| TW | 201206137 A | 2/2012 |

OTHER PUBLICATIONS

Non-final Office Action, U.S. Appl. No. 13/761,035, dated Feb. 13, 2014.

(Continued)

*Primary Examiner* — Thomas Lee
*Assistant Examiner* — Mohammad A Rahman
(74) *Attorney, Agent, or Firm* — Artegis Law Group, LLP

(57) ABSTRACT

A modulated clock device is provided that includes an update device for updating a phase of the modulated clock device. In one example, the update device includes an update phase multiplexer coupled to an output phase multiplexer of an output clock generator and configured to receive an input clock signal and one or more phases of the input clock signal; an output phase fractional counter coupled to the update phase multiplexer and configured to receive an update clock signal and to generate an output phase; and an update phase device coupled to the output phase fractional counter and to the update phase multiplexer. The output phase fractional counter is further configured to send the output phase to the output phase multiplexer and to the update phase device. The update phase device is configured to generate an update phase and to send the update phase to the update phase multiplexer.

20 Claims, 11 Drawing Sheets

(56) References Cited

U.S. PATENT DOCUMENTS

| | | | |
|---|---|---|---|
| 8,082,462 B1* | 12/2011 | Tidwell | 713/401 |
| 8,165,199 B2* | 4/2012 | Xiu et al. | 375/240.01 |
| 2006/0245531 A1* | 11/2006 | Leonowich | H03L 7/1976 |
| | | | 375/376 |
| 2008/0069284 A1* | 3/2008 | Kuhns | G06F 1/025 |
| | | | 375/376 |
| 2008/0298476 A1* | 12/2008 | Bereza | H03K 5/15026 |
| | | | 375/257 |
| 2011/0131439 A1* | 6/2011 | Renner et al. | 713/401 |
| 2011/0221497 A1 | 9/2011 | Chong et al. | |

OTHER PUBLICATIONS

Non-Final Office Action for U.S. Appl. No. 13/761,035 dated Feb. 13, 2014.
Final Rejection for U.S. Appl. No. 13/761,035 dated Sep. 4, 2014.
Non-Final Office Action for U.S. Appl. No. 13/761,035 dated Mar. 12, 2015.

* cited by examiner

APPROACH TO CLOCK FREQUENCY MODULATION OF A FIXED FREQUENCY CLOCK SOURCE

BACKGROUND OF THE INVENTION

Field of the Invention

The present invention generally relates to integrated circuits, and, more specifically, to an approach for clock frequency modulation of a fixed frequency clock source.

Description of the Related Art

A clock signal of a computer is a particular type of signal that oscillates between a high state and a low state and is utilized like a metronome to coordinate actions of various circuits within the computer. A clock generator within the computer generates the clock signal. Although there are more complex arrangements, a common clock signal is in the form of a square wave with a 50% duty cycle (i.e., percent of time that a device spends in an active state as a fraction of the total time under consideration), usually with a fixed, constant frequency. Circuits using the clock signal for synchronization may become active at either the rising edge, falling edge, or, in the case of double data rate, both at the rising edge and at the falling edge of the clock cycle.

In operation, devices, such as processing units, within the computer may require slightly different clock frequencies than the other devices within the computer that also require clock signals. One approach to meeting the different clock signal demands is to provide a dedicated clock for each device (e.g., each processing unit or other device) that requires a clock. For example, an integrated circuit may be configured with a different phase-locked loop (PLL) for each device that requires a different clock frequency, even if the required frequencies for the devices are only slightly different. For example, if the required clock frequency for one processing unit is 100.0 MHz while the required clock frequency for another processing unit is slightly different at 100.5 MHz, those two processing units typically require separate PLLs. That way, each device can operate at the required frequency for that device. Unfortunately, having numerous dedicated clocks (e.g., PLLs) tends to occupy a relatively large amount of space on a semiconductor circuit. Thus, such an approach is typically undesirable.

As the foregoing illustrates, what is needed in the art is a more optimized approach to providing clock signals to the different devices within a computer.

SUMMARY OF THE INVENTION

One implementation of the present technology includes a modulated clock device that includes an update device for updating a phase of the modulated clock device. In one example, the update device includes an update phase multiplexer coupled to an output phase multiplexer of an output clock generator and configured to receive an input clock signal and one or more phases of the input clock signal; an output phase fractional counter coupled to the update phase multiplexer and configured to receive an update clock signal and to generate an output phase; and an update phase device coupled to the output phase fractional counter and to the update phase multiplexer, wherein the output phase fractional counter is further configured to send the output phase to the output phase multiplexer and to the update phase device, and wherein the update phase device is configured to generate an update phase and to send the update phase to the update phase multiplexer.

Advantageously, the modulated clock system of the present technology can generate an output clock signal that is slightly faster or slightly slower than an existing source clock, and do so without the need for an extra phase-locked loop (PLL) for each device that requires a different clock frequency.

BRIEF DESCRIPTION OF THE DRAWINGS

So that the manner in which the above recited features of the present invention can be understood in detail, a more particular description of the invention, briefly summarized above, may be had by reference to implementations, some of which are illustrated in the appended drawings. It is to be noted, however, that the appended drawings illustrate only typical implementations of this invention and are therefore not to be considered limiting of its scope, for the invention may admit to other equally effective implementations.

DETAILED DESCRIPTION

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

System Overview

Figure 1:
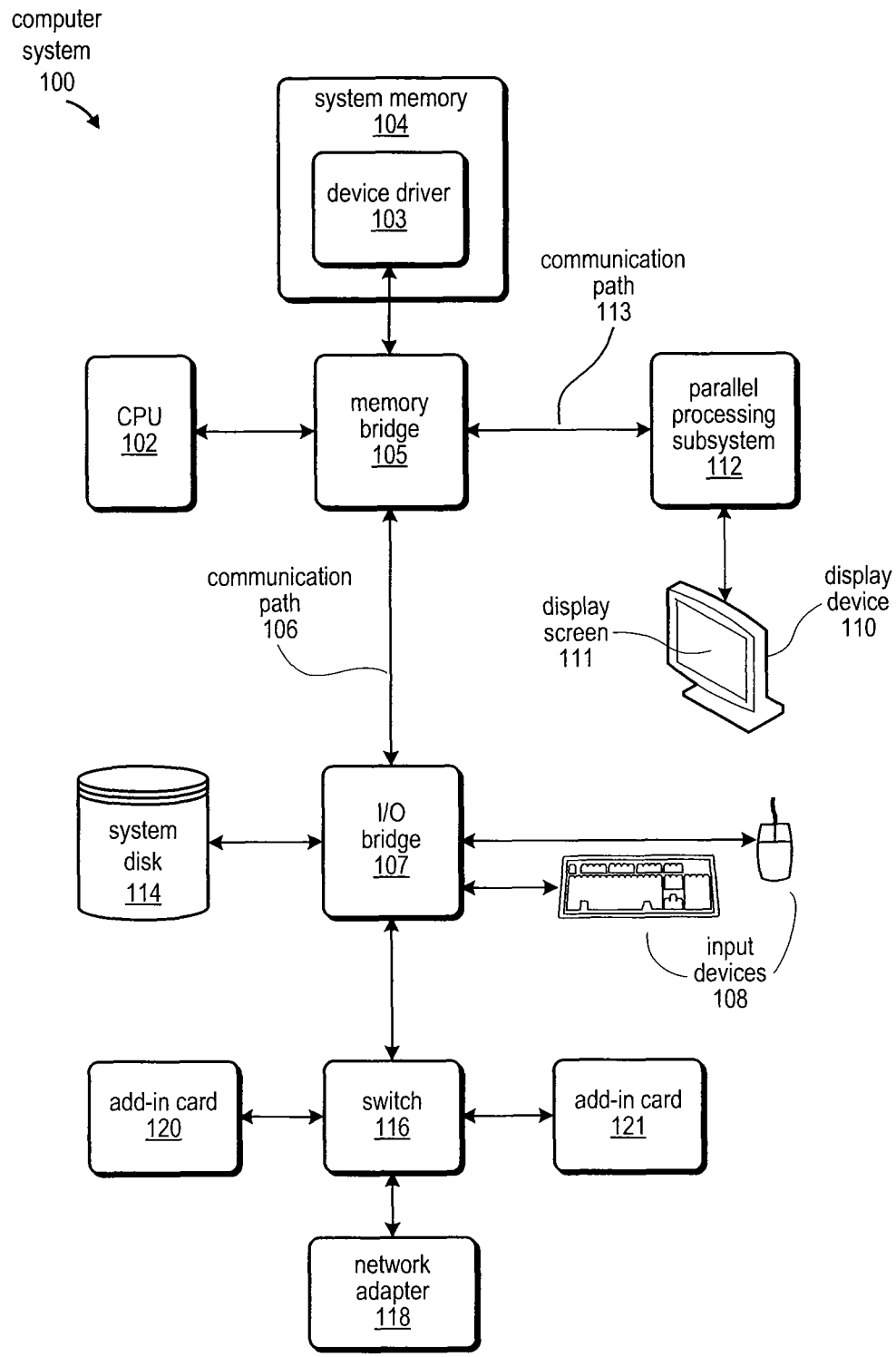
FIG. 1 is a block diagram illustrating a computer system configured to implement one or more aspects of the present invention.

FIG. 1 is a block diagram illustrating a computer system 100 configured to implement one or more aspects of the present invention. Computer system 100 includes a central processing unit (CPU) 102 and a system memory 104 that includes a device driver 103. CPU 102 and system memory 104 communicate via an interconnection path that may include a memory bridge 105. Memory bridge 105, which may be, for example, a Northbridge chip, is connected via a bus or other communication path 106 (e.g., a HyperTransport link, etc.) to an input/output (I/O) bridge 107. I/O bridge 107, which may be, for example, a Southbridge chip, receives user input from one or more user input devices 108 (e.g., keyboard, mouse, etc.) and forwards the input to CPU 102 via path 106 and memory bridge 105.

As also shown, a parallel processing subsystem 112 is coupled to memory bridge 105 via a bus or other communication path 113 (e.g., a peripheral component interconnect (PCI) express, Accelerated Graphics Port (AGP), and/or HyperTransport link, etc.). In one implementation, parallel processing subsystem 112 is a graphics subsystem that delivers pixels to a display device 110 (e.g., a conventional cathode ray tube (CRT) and/or liquid crystal display (LCD) based monitor, etc.). A system disk 114 is also connected to I/O bridge 107. A switch 116 provides connections between I/O bridge 107 and other components such as a network adapter 118 and various add-in cards 120 and 121. Other components (not explicitly shown), including universal serial bus (USB) and/or other port connections, compact disc (CD) drives, digital video disc (DVD) drives, film recording devices, and the like, may also be connected to I/O bridge 107. Communication paths interconnecting the various components in FIG. 1 may be implemented using any suitable protocols, such as PCI, PCI Express (PCIe), AGP, HyperTransport, and/or any other bus or point-to-point communication protocol(s), and connections between different devices that may use different protocols as is known in the art. A device is hardware or a combination of hardware and software. A component is also hardware or a combination of hardware and software.

As further described below with reference to FIGS. 2-11, parallel processing subsystem 112 includes parallel processing units (PPUs) configured to execute a software application (e.g., device driver 103) by using circuitry that utilizes one or more clocks. Those packet types are specified by the communication protocol used by communication path 113. In situations where a new packet type is introduced into the communication protocol (e.g., due to an enhancement to the communication protocol), parallel processing subsystem 112 can be configured to generate packets based on the new packet type and to exchange data with CPU 102 (or other processing units) across communication path 113 using the new packet type.

In one implementation, the parallel processing subsystem 112 incorporates circuitry optimized for graphics and video processing, including, for example, video output circuitry, and constitutes a graphics processing unit (GPU). In another implementation, the parallel processing subsystem 112 incorporates circuitry optimized for general purpose processing, while preserving the underlying computational architecture, described in greater detail herein. In yet another implementation, the parallel processing subsystem 112 may be integrated with one or more other system elements, such as the memory bridge 105, CPU 102, and I/O bridge 107 to form a system on chip (SoC).

It will be appreciated that the system shown herein is illustrative and that variations and modifications are possible. The connection topology, including the number and arrangement of bridges, the number of CPUs 102, and the number of parallel processing subsystems 112, may be modified as desired. For instance, in some implementations, system memory 104 is connected to CPU 102 directly rather than through a bridge, and other devices communicate with system memory 104 via memory bridge 105 and CPU 102. In other alternative topologies, parallel processing subsystem 112 is connected to I/O bridge 107 or directly to CPU 102, rather than to memory bridge 105. In still other implementations, I/O bridge 107 and memory bridge 105 might be integrated into a single chip. Large implementations may include two or more CPUs 102 and two or more parallel processing systems 112. The particular components shown herein are optional; for instance, any number of add-in cards or peripheral devices might be supported. In some implementations, switch 116 is eliminated, and network adapter 118 and add-in cards 120, 121 connect directly to I/O bridge 107.

Figure 2:
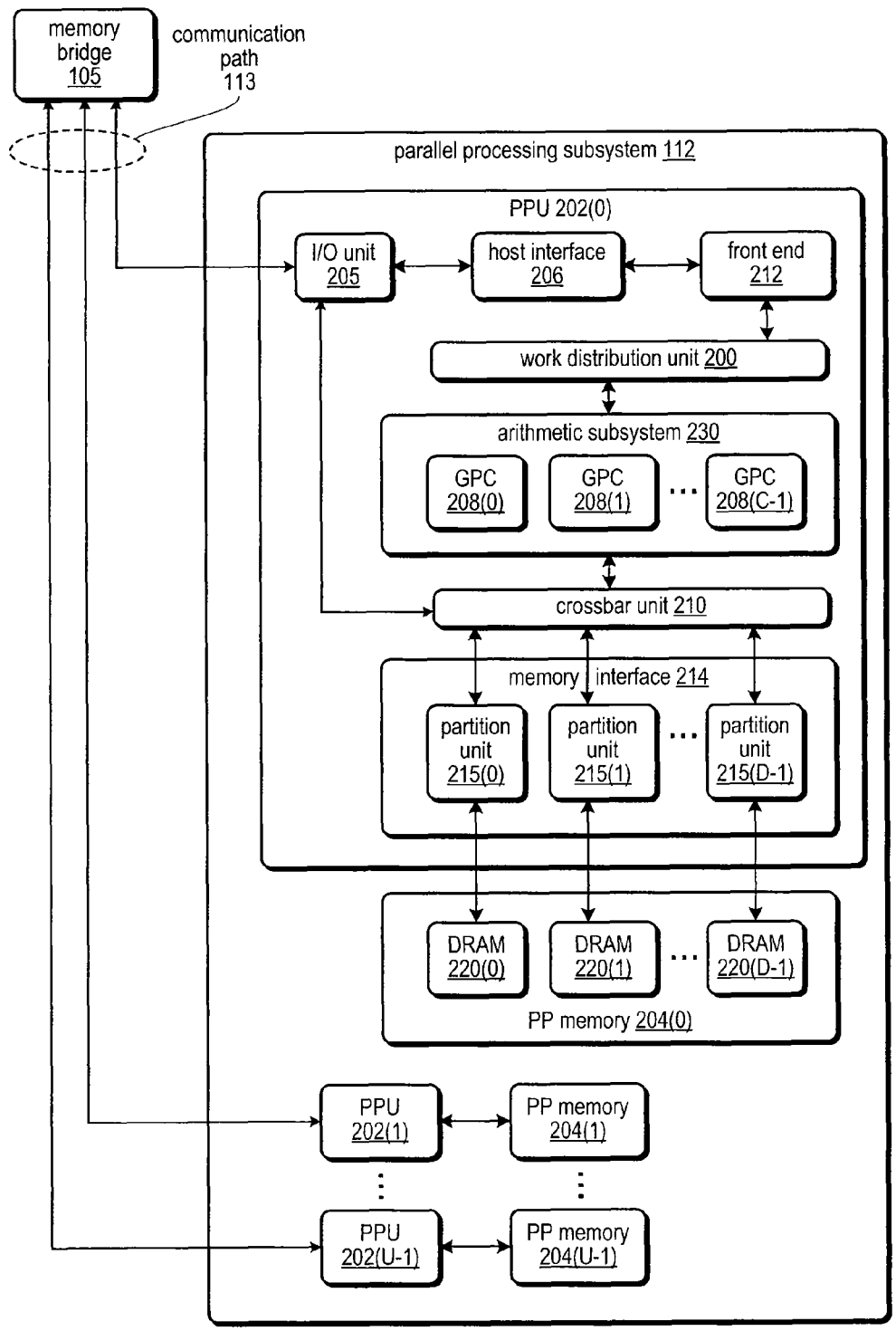
FIG. 2 is a block diagram illustrating a parallel processing subsystem, according to one embodiment of the present invention.

FIG. 2 is a block diagram illustrating a parallel processing subsystem 112, according to one embodiment of the present invention. As shown, parallel processing subsystem 112 includes one or more parallel processing units (PPUs) 202, each of which is coupled to a local parallel processing (PP) memory 204. In general, a parallel processing subsystem includes a number U of PPUs, where U≥1. (Herein, multiple instances of like objects are denoted with reference numbers identifying the object and parenthetical numbers identifying the instance where needed.) PPUs 202 and parallel processing memories 204 may be implemented using one or more integrated circuit devices, such as programmable processors, application specific integrated circuits (ASICs), or memory devices, or in any other technically feasible fashion.

Referring again to FIG. 1, in some implementations, some or all of PPUs 202 in parallel processing subsystem 112 are graphics processors with rendering pipelines that can be configured to perform various tasks related to generating pixel data from graphics data supplied by CPU 102 and/or system memory 104 via memory bridge 105 and bus 113, interacting with local parallel processing memory 204 (which can be used as graphics memory including, e.g., a conventional frame buffer) to store and update pixel data, delivering pixel data to display device 110, and the like. In some implementations, parallel processing subsystem 112 may include one or more PPUs 202 that operate as graphics processors and one or more other PPUs 202 that are used for general-purpose computations. The PPUs may be identical or different, and each PPU may have its own dedicated parallel processing memory device(s) or no dedicated parallel processing memory device(s). One or more PPUs 202 may output data to display device 110 or each PPU 202 may output data to one or more display devices 110.

In operation, CPU 102 is the master processor of computer system 100, controlling and coordinating operations of other system components. In particular, CPU 102 issues commands that control the operation of PPUs 202. In some implementations, CPU 102 writes a stream of commands for each PPU 202 to a pushbuffer (not explicitly shown in either FIG. 1 or FIG. 2) that may be located in system memory 104, parallel processing memory 204, or another storage location accessible to both CPU 102 and PPU 202. PPU 202 reads the command stream from the pushbuffer and then executes commands asynchronously relative to the operation of CPU 102.

Referring back now to FIG. 2, each PPU 202 includes an I/O unit 205 that communicates with the rest of computer system 100 via communication path 113, which connects to memory bridge 105 (or, in one alternative implementation, directly to CPU 102). The connection of PPU 202 to the rest of computer system 100 may also be varied. In some implementations, parallel processing subsystem 112 is implemented as an add-in card that can be inserted into an expansion slot of computer system 100. In other implementations, a PPU 202 can be integrated on a single chip with a bus bridge, such as memory bridge 105 or I/O bridge 107. In still other implementations, some or all elements of PPU 202 may be integrated on a single chip with CPU 102.

In one implementation, communication path 113 is a PCIe link, in which dedicated lanes are allocated to each PPU 202, as is known in the art. Other communication paths may also be used. As mentioned above, a contraflow interconnect may also be used to implement the communication path 113, as well as any other communication path within the computer system 100, CPU 102, or PPU 202. An I/O unit 205 generates packets (or other signals) for transmission on communication path 113 and also receives all incoming packets (or other signals) from communication path 113, directing the incoming packets to appropriate components of PPU 202. For example, commands related to processing tasks may be directed to a host interface 206, while commands related to memory operations (e.g., reading from or writing to parallel processing memory 204) may be directed to a memory crossbar unit 210. Host interface 206 reads each pushbuffer and outputs the work specified by the pushbuffer to a front end 212.

Each PPU 202 advantageously implements a highly parallel processing architecture. As shown in detail, PPU 202(0) includes an arithmetic subsystem 230 that includes a number C of general processing clusters (GPCs) 208, where C≥1. Each GPC 208 is capable of executing a large number (e.g., hundreds or thousands) of threads concurrently, where each thread is an instance of a program. In various applications, different GPCs 208 may be allocated for processing different types of programs or for performing different types of computations. The allocation of GPCs 208 may vary dependent on the workload arising for each type of program or computation.

GPCs 208 receive processing tasks to be executed via a work distribution unit 200, which receives commands defining processing tasks from front end unit 212. Front end 212 ensures that GPCs 208 are configured to a valid state before the processing specified by the pushbuffers is initiated.

When PPU 202 is used for graphics processing, for example, the processing workload for operation can be divided into approximately equal sized tasks to enable distribution of the operations to multiple GPCs 208. A work distribution unit 200 may be configured to produce tasks at a frequency capable of providing tasks to multiple GPCs 208 for processing. In one implementation, the work distribution unit 200 can produce tasks fast enough to simultaneously maintain busy multiple GPCs 208. By contrast, in conventional systems, processing is typically performed by a single processing engine, while the other processing engines remain idle, waiting for the single processing engine to complete its tasks before beginning their processing tasks. In some implementations of the present invention, portions of GPCs 208 are configured to perform different types of processing. For example, a first portion may be configured to perform vertex shading and topology generation. A second portion may be configured to perform tessellation and geometry shading. A third portion may be configured to perform pixel shading in screen space to produce a rendered image. Intermediate data produced by GPCs 208 may be stored in buffers to allow the intermediate data to be transmitted between GPCs 208 for further processing.

Memory interface 214 includes a number D of partition units 215 that are each directly coupled to a portion of parallel processing memory 204, where D≥1. As shown, the number of partition units 215 generally equals the number of DRAM 220. In other implementations, the number of partition units 215 may not equal the number of memory devices. Dynamic random access memories (DRAMs) 220 may be replaced by other suitable storage devices and can be of generally conventional design. Render targets, such as frame buffers or texture maps may be stored across DRAMs 220, allowing partition units 215 to write portions of each render target in parallel to efficiently use the available bandwidth of parallel processing memory 204.

Any one of GPCs 208 may process data to be written to any of the DRAMs 220 within parallel processing memory 204. Crossbar unit 210 is configured to route the output of each GPC 208 to the input of any partition unit 215 or to another GPC 208 for further processing. GPCs 208 communicate with memory interface 214 through crossbar unit 210 to read from or write to various external memory devices. In one implementation, crossbar unit 210 has a connection to memory interface 214 to communicate with I/O unit 205, as well as a connection to local parallel processing memory 204, thereby enabling the processing cores within the different GPCs 208 to communicate with system memory 104 or other memory that is not local to PPU 202. In the implementation shown in FIG. 2, crossbar unit 210 is directly connected with I/O unit 205. Crossbar unit 210 may use virtual channels to separate traffic streams between the GPCs 208 and partition units 215.

Again, GPCs 208 can be programmed to execute processing tasks relating to a wide variety of applications, including but not limited to, linear and nonlinear data transforms, filtering of video and/or audio data, modeling operations (e.g., applying laws of physics to determine position, velocity and other attributes of objects), image rendering operations (e.g., tessellation shader, vertex shader, geometry shader, and/or pixel shader programs), and so on. PPUs 202 may transfer data from system memory 104 and/or local parallel processing memories 204 into internal (on-chip) memory, process the data, and write result data back to system memory 104 and/or local parallel processing memories 204, where such data can be accessed by other system components, including CPU 102 or another parallel processing subsystem 112.

A PPU 202 may be provided with any amount of local parallel processing memory 204, including no local memory, and may use local memory and system memory in any combination. For instance, a PPU 202 can be a graphics processor in a unified memory architecture (UMA) implementation. In such implementations, little or no dedicated graphics (parallel processing) memory would be provided, and PPU 202 would use system memory exclusively or almost exclusively. In UMA implementations, a PPU 202 may be integrated into a bridge chip or processor chip or provided as a discrete chip with a high-speed link (e.g., PCIe) connecting the PPU 202 to system memory via a bridge chip or other communication means.

As noted above, any number of PPUs 202 can be included in a parallel processing subsystem 112. For instance, multiple PPUs 202 can be provided on a single add-in card, or multiple add-in cards can be connected to communication path 113, or one or more of PPUs 202 can be integrated into a bridge chip. PPUs 202 in a multi-PPU system may be identical to or different from one another. For instance, different PPUs 202 might have different numbers of processing cores, different amounts of local parallel processing memory, and so on. Where multiple PPUs 202 are present, those PPUs may be operated in parallel to process data at a higher throughput than is possible with a single PPU 202.

Systems incorporating one or more PPUs 202 may be implemented in a variety of configurations and form factors, including desktop, laptop, handheld personal computers, mobile devices, servers, workstations, game consoles, embedded systems, and the like.

One embodiment of the invention may be implemented as a program product for use on a computer system, such as the computer system 100 of FIG. 1 for example. One or more programs of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored.

Overview of a Clock System

Figure 3:
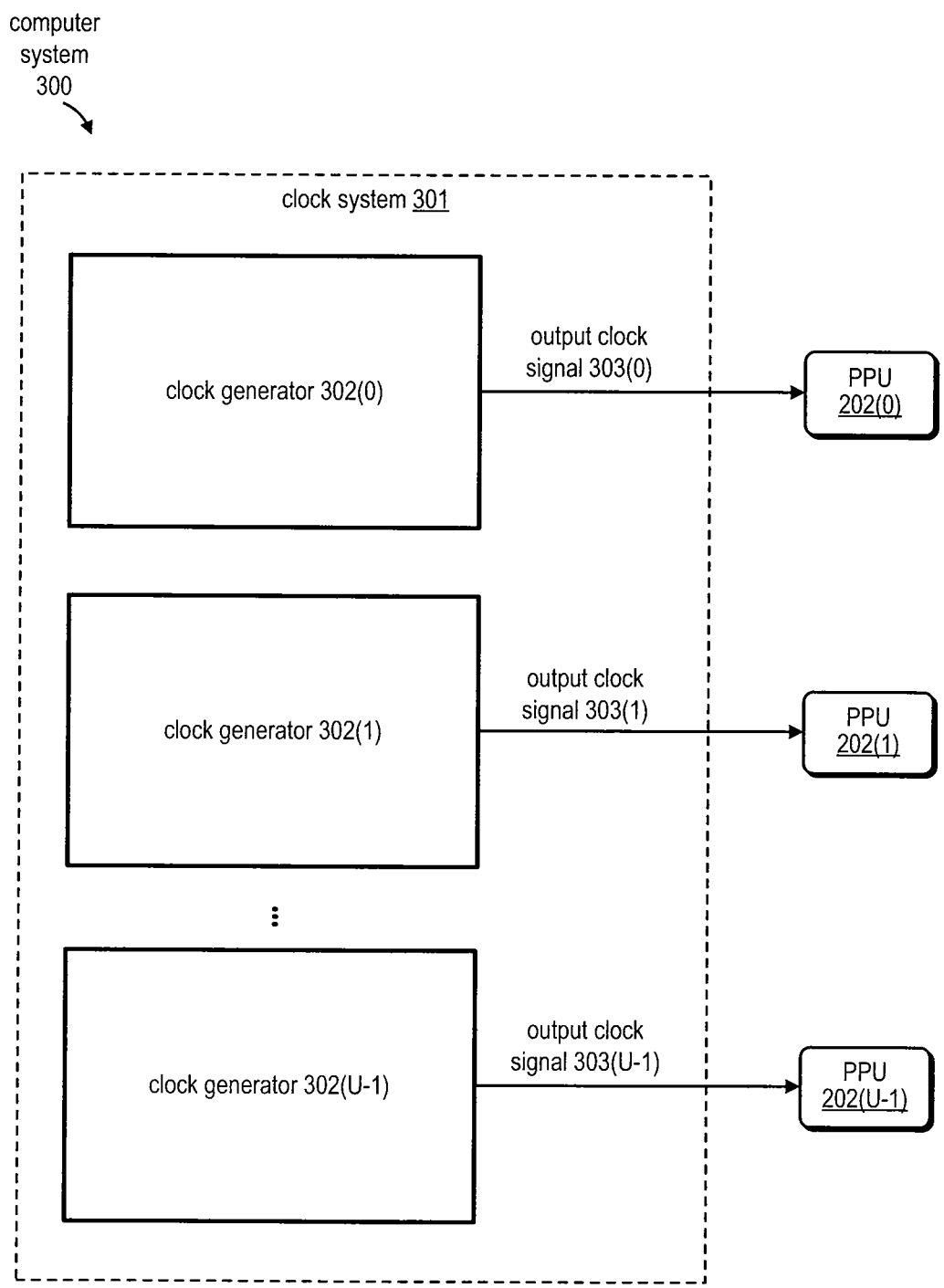
FIG. 3 is a block diagram of a computer system including a conventional clock system.

FIG. 3 is a block diagram of a conventional computer system 300 including a clock system 301. In computers, synchronization is vital to computer operations. The clock system 301 synchronizes tasks that are carried out by the conventional computer system 300. Such tasks may include, for example, loading data before manipulating the data, among a multitude of other computer tasks. All devices of the computer do not necessarily operate on a singular clock. Different devices on the conventional computer system 300 may require operation at different clock frequencies for the different devices. For explanatory purposes, components of the conventional computer system 300 that require slightly different clock frequencies are PPUs 202, including PPU 202(0), PPU 202(1), . . . , and PPU 202(U−1), where U≥1.

The clock system 301 includes clock generators 302, including clock generator 302(0), clock generator 302(1), . . . , and clock generator 302(U−1), where U≥1. Each clock generator 302 is coupled to a particular device because, in this example, each particular device operates at a different clock frequency. For instance, the clock generator 302(0) is coupled to the PPU 202(0), and so on. Each clock generator 302 is configured to send an output clock signal 303 to a particular device. For example, the clock generator 302(0) is configured to send an output clock signal 303(0) to the PPU 202(0), and so on. Each output clock signal (e.g., output clock signal 302(0)) is a continuous stream of precise high and low pulses that are all substantially the same length. One clock cycle is the time that passes from the start of one high pulse, until the start of the next high pulse.

The circuitry in each clock generator 302 that emits each output signal 302 for each particular device 202 can include an electronic circuit that includes a phase-locked loop (PLL). Typically, a reference clock (not shown) drives the phase-locked loop (PLL), which then drives a clock distribution (not shown). The clock distribution is usually balanced so that the clock arrives at every endpoint simultaneously. One of those endpoints is the PLL's feedback input. The function of the PLL is to compare the distributed clock to the incoming reference clock, and vary the phase and frequency of its output until the reference and feedback clocks are phase and frequency matched. PLLs are ubiquitous and can tune clocks in systems that are several feet across, as well as clocks in small portions of individual chips.

However, having a PLL for each clock generator 302 consumes a relatively large area on an integrated circuit. Accordingly, an approach provided below reduces the number of PLLs and/or other devices that are required to generate clock signals of different frequencies.

Overview of Clock Frequency Modulation

Figure 4:
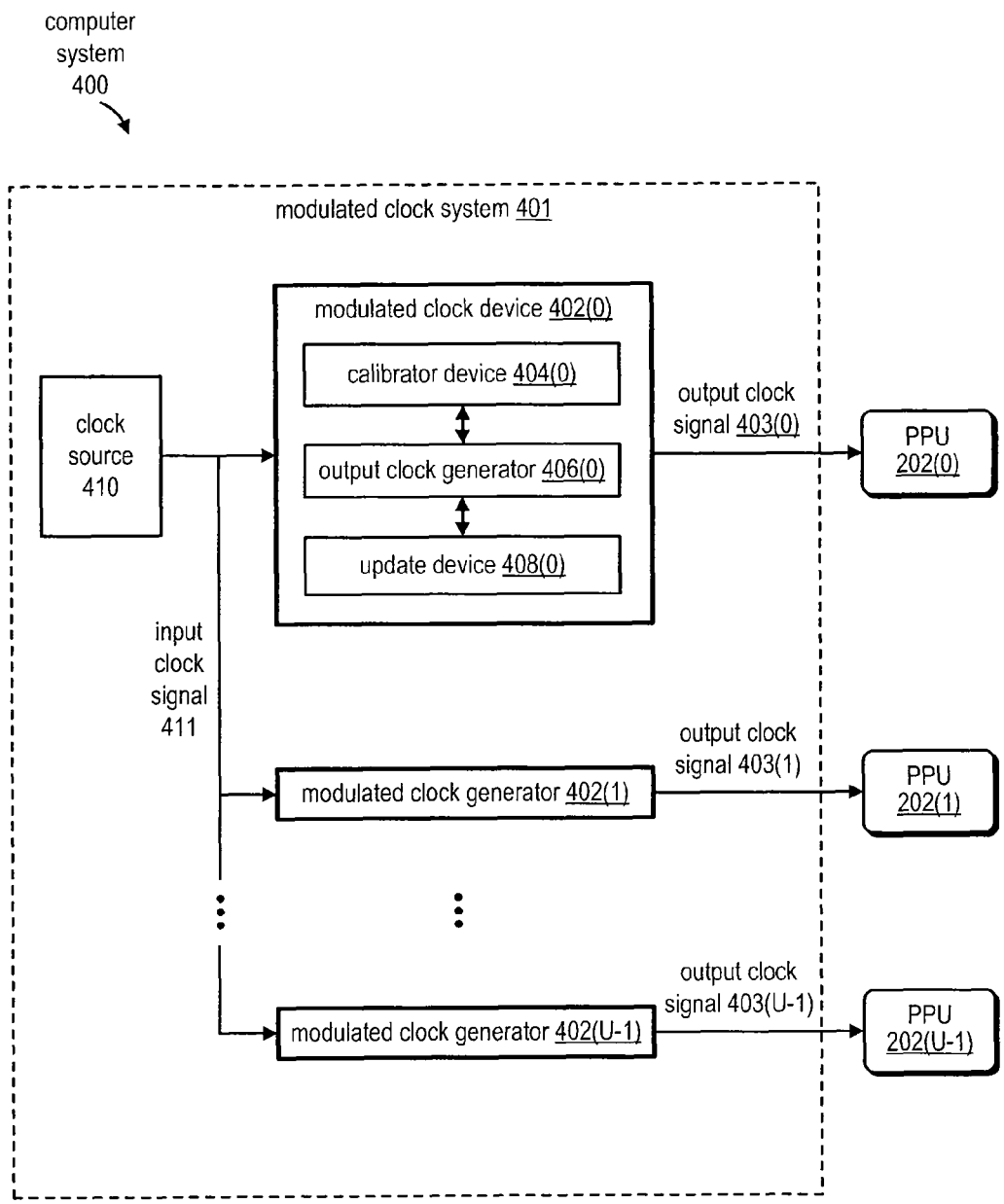
FIG. 4 is a block diagram of a computer system including a modulated clock system 401, according to one embodiment of the present invention.

FIG. 4 is a block diagram of a computer system 400 including a modulated clock system 401, according to one embodiment of the present invention. For explanatory purposes, the modulated clock system 401 includes one clock source 410 (e.g., one PLL) coupled to modulated clock devices 402. Instead of the clock generators 302 (e.g., PLLs) of FIG. 3, the modulated clock system 401 of FIG. 4 includes modulated clock devices 402 and one clock source 410. Accordingly, the modulated clock system 401 substantially reduces the number of PLLs and/or other devices required to generate clock signals for the different devices of the computer system 400.

Also for explanatory purposes, components of the computer system 400 that require slightly different clock frequencies are PPUs 202, including PPU 202(0), PPU 202(1), . . . , and PPU 202(U−1), where U≥1. However, the present approach is not so limited. For example, one PPU (e.g., PPU 202(0)) may include multiple devices that each requires operation at different clock frequencies. Alternatively, the devices that require different frequencies may not even be a part of a PPU of a GPU, but rather a part of a CPU or other device for example.

The modulated clock devices 402 include a modulated clock device 402(0), a modulated clock device 402(1), . . . , and a modulated clock device 402(U−1), where U≥1. Each modulated clock device 402 is coupled to a particular device because, in this example, each particular device operates at a different clock frequency. For instance, the modulated clock device 402(0) is couple to the PPU 202(0), and so on. Each modulated clock device 402 is configured to send an output clock signal 403 to a particular device. Each modulated clock device 402 can provide a different clock signal to a different device (e.g., PPU 202(0), PPU 202(1), etc.). For example, the clock generator 302(0) is configured to send an output clock signal 302(0) to the PPU 202(0), and so on. Likewise, the modulated clock device 402(1) is configured to send a different output clock signal 403(1) to the PPU 202(1), and so on.

Each modulated clock device 402 includes a calibrator device 404, an output clock generator 406, and an update device 408. For example, modulated clock device 402(0) includes a calibrator device 404(0), an output clock generator 406(0), and an update device 408(0). The modulated clock device 402(1) includes a calibrator device 404(1), an output clock generator 406(1), and an update device 408(1). The modulated clock device 402(U−1) includes a calibrator device 404(U−1), an output clock generator 406(U−1), and an update device 408(U−1), where U≥1.

In some instances, the calibrator device 404(0) can present challenges in terms physical area the calibrator device 404(0) occupies on an integrated circuit and in terms of processing efforts required to perform calibration operations. Accordingly, an alternative embodiment (not shown) is for the modulated clock system 401 to have one modulated clock device 402(0) that includes the following (which are discussed further below with reference to FIGS. 5-8):

one calibrator device 404, one sequence of delay devices, multiple output phase multiplexers 516, and multiple update devices 408.

The output clock generator 406(0) is further described below with reference to FIGS. 5 and 6. The update device 408(0) is further described below with reference to FIG. 7. The calibrator device 404(0) is further described below with reference to FIG. 8. The other devices of like reference numerals are configured similarly.

Output Clock Generator

Figure 5:
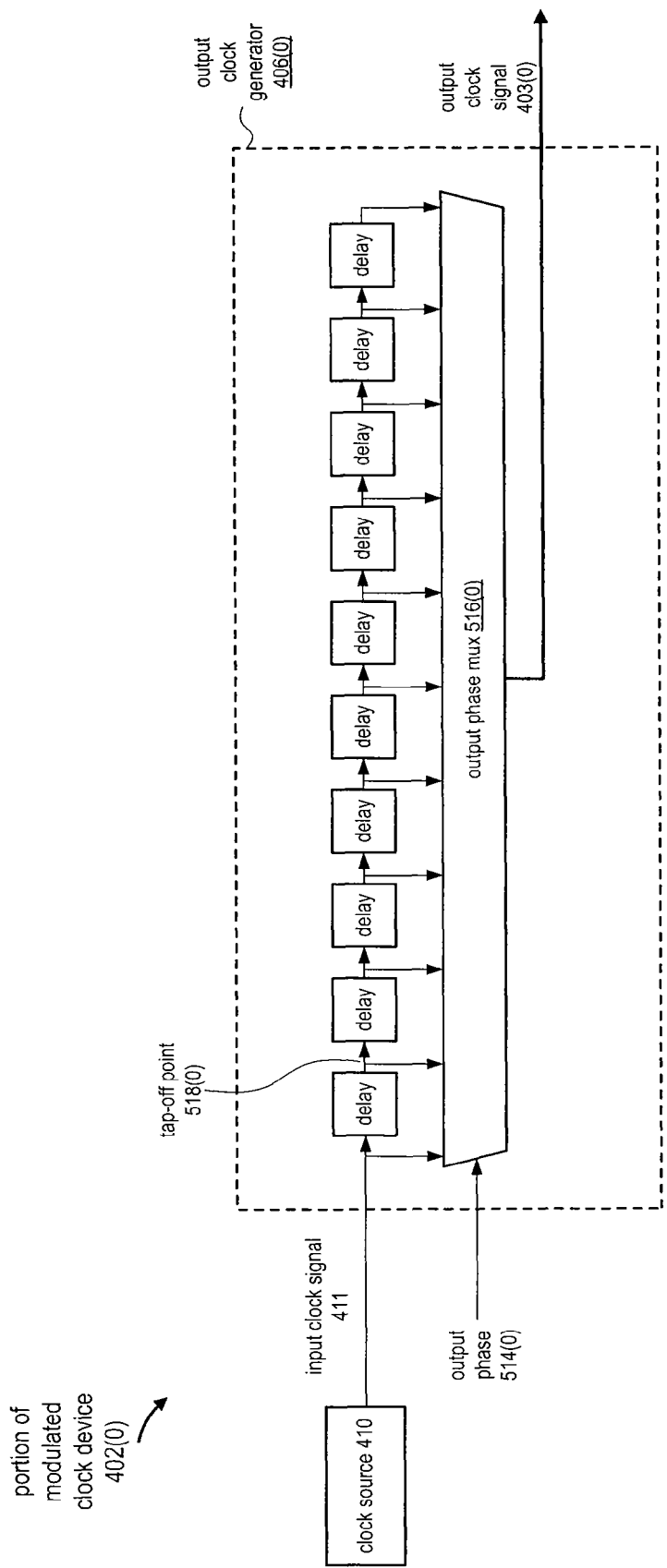
FIG. 5 is a block diagram of a portion of the modulated clock device of FIG. 4, according to one embodiment of the present invention.

FIG. 5 is a block diagram of a portion of the modulated clock device 402(0) of FIG. 4, according to one embodiment of the present invention. The output clock generator 406(0) is coupled to the clock source 410. The output clock generator 406(0) enables a digital way to modulate an input clock signal 411 of the fixed frequency clock source 410 (e.g., PLL) by adding a sequence of delay devices (e.g., digital delay devices) behind the clock source 410 with tap-off points after each delay stage. A tap-off point is a connection point (e.g., node) between a delay device and an output phase multiplexer (mux) 516(0). A delay device is a digital device that is configured to receive a clock signal (e.g., the input clock signal 411 from the clock source 410, or a delayed clock signal from a previous digital delay device) and to provide a delayed clock signal that is delayed by a phase relative to the received clock signal. This concept of delay is further described below with reference to FIG. 6. In this example of FIG. 5, the output clock generator 406(0) includes 10 delay stages and 10 corresponding tap-off points. For example, a tap-off point 518 is located after a first delay stage. For simplicity of FIG. 5, the other tap-off points do not have reference numerals. In another example, the output clock generator 406(0) can include any number of delays. In this example of FIG. 5, the delays are arranged in a series. In another example (not shown), the delays may be arranged in parallel.

As also shown in FIG. 5, the output clock generator 406(0) includes an output phase multiplexer (mux) 516 that is configured to receive the input clock signal 411 and each delayed clock signal as modified by each delay. The output phase mux 516(0) is also configured to receive the selection of the output phase 514(0). The output phase 514(0) sets the phase at which the output phase mux 516(0) is to deliver the output clock signal 403(0). The selection of the output phase is provided by an update device, which is further described below with reference to FIG. 7. The output clock generator 406(0) is configured to modulate the input clock signal 411 in order to satisfy operating parameters of an electronic component configured to receive the output clock signal 403(0) of the output clock generator 406(0).

As described above with reference to FIG. 4, a particular component may require a different clock frequency than the frequency of the input clock signal 411 and/or other components. Clock modulation of the output clock generator 406(0) enables the system to provide a required clock frequency to a particular component, without adding an additional PLL.

In FIG. 5, by using the output phase mux 516, the output clock generator 406(0) can modulate the input clock signal 411 by changing the tap-off point (e.g., moving forward to a later tap-off point, or moving backward to an earlier tap) at a high speed. By continuously moving forward from one tap to a later tap in the sequence of delay stages, the output clock generator 406(0) can provide an output clock signal 403(0) that is slower than the input clock signal 411. In contrast, by continuously moving backward from one tap to an earlier tap, the output clock generator 406(0) can provide an output clock signal 403(0) that is faster than the input clock signal 411. These concepts of moving forward or moving backward among taps are further discussed below with reference to FIG. 6.

Figure 6:
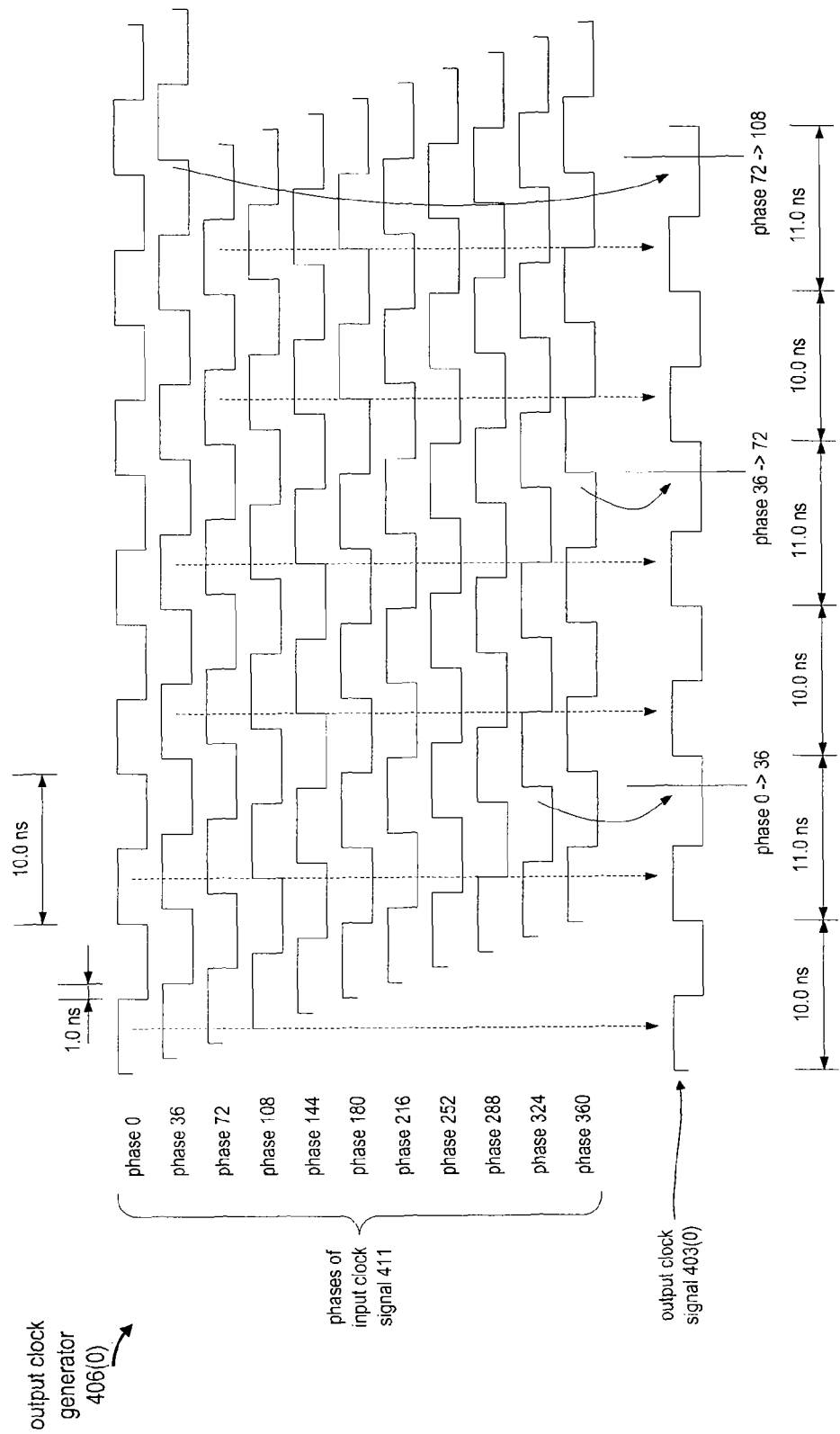
FIG. 6 is a diagram that illustrates example mathematics of clock frequency modulation carried out by an output clock generator, according to one embodiment of the present invention.

FIG. 6 is a diagram that illustrates example mathematics of clock frequency modulation carried out by an output clock generator 406(0), according to one embodiment of the present invention. In this example, assume a requirement of the output clock generator 406(0) is to generate a clock having a frequency of 95.2 MHz (or 10.5 ns/cycle) and that the output clock generator receives an input clock signal 411 of 100 MHz (or 10.0 ns/cycle). A typical configuration would be to provide an extra PLL to generate the required 95.2 MHz because there would otherwise be no way to achieve the required 95.2 MHz from the 100 MHz input clock signal 411. In contrast, in the present system, instead of adding an extra PLL, the system can modulate the input clock signal of 100 MHz in order to generate the required frequency of 95.2 MHz.

In the example of FIG. 6, the input clock signal is divided evenly into 10 phases, including phase 0, phase 36, phase 72, phase 108, phase 144, phase 180, phase 216, phase 252, phase 288, phase 324, and phase 360 (or phase 0). Phase 0 is the phase of the original input clock signal 411. Phase 360 is 360 degrees shifted from phase 0, but, as a practical matter, can be considered as being equivalent to phase 0. Phase 36 is 36 degrees shifted from phase 0. Phase 72 is 72 degrees shifted from phase 0, and so on. The duration of each clock cycle of each of these phases is 10.0 ns/cycle (or 100 MHz), which is the duration of the cycle of the input clock signal 411. The time distance between two adjacent phases is 0.1 ns. The delay times do not necessarily have to be equal. In another embodiment (not shown), at least two of the delay times are unequal.

In order to generate a frequency of 95.2 MHz (or 10.5 ns/cycle) for the output clock signal 403(0), the output clock generator 406(0) shifts the output clock signal 403(0) to the appropriate phase at designated times. A result is that some clock cycles of the output clock signal 403(0) are longer than required duration (e.g., 10.5 ns), while some clock cycles are shorter than the required duration (e.g., 10.5 ns). Over an extended period, an average duration of the clock cycles is substantially equal to the sum of all clock cycle durations divided by the number of clock cycles generated. The average duration of the clock cycles thereby simulates the required frequency (e.g., 10.5 ns) of the output clock signal 403(0).

In this example of FIG. 6, half of the clock cycles of the output clock signal 403(0) are each 10 ns in duration, while half of the clock cycles are each 11.0 ns in duration. Over an extended period, the average duration of the clock cycles is about 10.5 ns, which equals (10.0 ns+11.0 ns)/2. Thus, the average duration of the clock cycles simulates the required frequency of 95.2 MHz for the output clock signal 403(0).

As shown in FIG. 6, for the first clock cycle of 10.0 ns, the output clock generator 406(0) does not shift the tap-off point. Then, at an appropriate time before the end of the second clock cycle, the output clock generator 406(0) shifts the tap-off point from phase 0 to phase 36, so that the second cycle is 11.0 ns in duration. The appropriate time of the shift is at a time when both phases (e.g., phase 0 and phase 36) are either at a high state or when both phases are at a low state, so that an unclean shift does not occur. Next, for the third cycle of 10.0 ns, the output clock generator 406(0) does not carry out a shift. Then, at an appropriate time before the end of the fourth clock cycle, the output clock generator 406(0) shifts the tap-off point from phase 36 to phase 72, so that the fourth cycle is 11.0 ns in duration. Again, the appropriate time of the shift is at a time when both phases are either at a high state or when both phases (e.g., phase 36 and phase 72) are at a low state, so that an unclean shift does not occur. Next, for the fifth cycle of 10.0 ns, the output clock generator 406(0) does not carry out a shift. Then, at an appropriate time before the end of the sixth clock cycle, the output clock generator 406(0) shifts the tap-off point from phase 72 to phase 108, so that the sixth cycle is 11.0 ns in duration. Again, the appropriate time of the shift is at a time when both phases (e.g., phase 72 and phase 708) are either at a high state or when both phases are at a low state, so that an unclean shift does not occur. The output clock generator 406(0) continues to carry out a sequence of shifts in a similar manner in order to simulate an average clock cycle, which is 10.5 ns/cycle (or 95.2 MHz) in this example.

Note that the previous example illustrates how the output clock generator 406(0) can slow down a clock frequency (e.g., reduce 100 MHz input to 95.2 MHz output). In a similar manner, the output clock generator 406(0) can speed up a clock frequency (e.g., increase 100 MHz input to 105 MHz output). To speed up clock frequency, instead of making a sequence of shifts to a subsequent phase, the output clock generator 406(0) is configured to make a sequence of shifts to a prior phase. As an example (not shown), for the first clock cycle of 10.0 ns, the output clock generator 406(0) does not carry out a shift. Then, at an appropriate time before the end of the second clock cycle, the output clock generator 406(0) shifts the tap-off point from phase 0 to phase 324, so that the second cycle is 9.0 ns in duration. The appropriate time of the shift is at a time when both phases (e.g., phase 0 and phase 324) are either at a high state or when both phases are at a low state, so that an unclean shift does not occur. Next, for the third cycle of 10.0 ns, the output clock generator 406(0) does not carry out a shift. Then, at an appropriate time before the end of the fourth clock cycle, the output clock generator 406(0) shifts the tap-off point from phase 324 to phase 288, so that the fourth cycle is 9.0 ns in duration. Again, the appropriate time of the shift is at a time when both phases are either at a high state or when both phases (e.g., phase 324 and phase 288) are at a low state, so that an unclean shift does not occur. Next, for the fifth cycle of 10.0 ns, the output clock generator 406(0) does not carry out a shift. Then, at an appropriate time before the end of the sixth clock cycle, the output clock generator 406(0) shifts the tap-off point from phase 288 to phase 252, so that the sixth cycle is 9.0 ns in duration. Again, the appropriate time of the shift is at a time when both phases (e.g., phase 288 and phase 252) are either at a high state or when both phases are at a low state, so that an unclean shift does not occur. The output clock generator 406(0) continues to carry out a sequence shifts in a similar manner in order to simulate an average clock cycle, which is 9.5 ns/cycle (or 105 MHz) in this example.

A method for the modulated clock device 402(0) is further discussed below with reference to FIG. 9.

Clock Update Device

Figure 7:
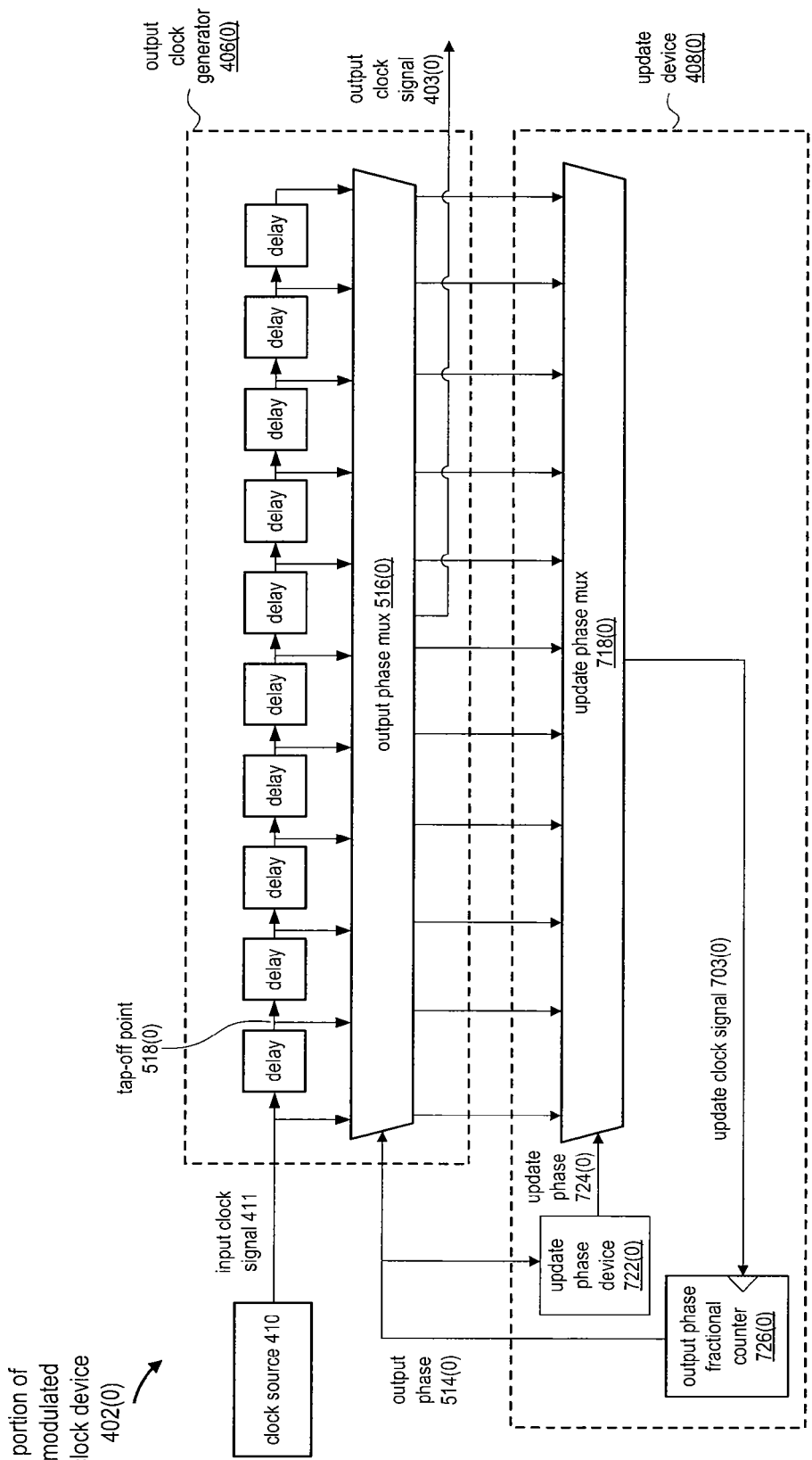
FIG. 7 is another block diagram of a portion of the modulated clock device of FIG. 4, according to one embodiment of the present invention.

FIG. 7 is another block diagram of a portion of the modulated clock device 402(0) of FIG. 4, according to one embodiment of the present invention. A purpose of the update device 408(0) is to shift the tap-off point 518(0) to the appropriate phase at the appropriate time. The performance of each update needs to occur slightly before the output clock generator 4060(0) generates the next output phase because there is a non-zero time between each phase update and the generation of the next output phase.

The update device 408(0) is coupled to the output clock generator 406(0), which is coupled to the clock source 410. The update device 408(0) includes an update phase mux 718(0) which has inputs to receive the phases of the input clock signal 411. In this example, the update phase mux 718(0) receives the original input clock signal 411 and 10 delayed phases of the input clock signal 411. An output phase fractional counter 726(0) is coupled to the update phase mux 718(0) and the output phase mux 516(0). The output phase fractional counter 726(0) is configured to receive an update clock signal 703(0) from the update phase mux 718(0), and to send the output phase 514(0) to the output phase mux 516(0). An update phase device 722(0) is coupled to the output phase fractional counter 726(0) and the update phase mux 718(0). The update phase device 722(0) is configured to receive the output phase 514(0) from the output phase fractional counter 726(0) and to send an update phase 724(0) to the update phase mux 718(0).

The output phase fractional counter 726(0) keeps track of (e.g., counts) the update clock signal 703(0) in order to deliver the current output phase 514(0). The output phase fractional counter 726(0) thereby calculates a current tap-off point for the output phase mux 516(0). The output phase fractional counter 726(0) is a fractional accumulator/subtractor modulo of the number of active taps. For example, let N equal the number of taps for 360 degrees of phases of the input clock signal 411. Let OP equal the current output phase 514(0). Let UP equal the current update phase 724(0). Then, for explanatory purposes, the update phase device 722(0) may calculate the update phase UP according to the following example equation:

$$UP = \left[OP + \text{int}\left(\frac{3}{4}*(N-1)\right)\right] \bmod N \qquad \text{(Equation 1)}$$

For instance, if OP equals 4 and N equals 10, then UP equals 0, which equals [4+int(3*(10−1)/4)] mod 10. If OP equals 5 and N equals 10, then UP equals 1, which equals [5+int(3*(10−1)/4)] mod 10, and so on.

Equation 1 is an example of how the update phase device 722(0) can shift the update phase UP from the output phase OP in such a way that an edge of the update clock signal 703(0) substantially always falls in between a negative edge and a positive edge of the output clock signal 403(0). This shift of the update phase ensures that there are substantially no glitches (e.g., no unclean switches) on the output clock signal 403(0) due to changing the taps in the output phase mux 516(0). The present technology is not limited to Equation 1. The update phase device 722(0) may be configured to shift in many alternative ways that are well within the scope of the present technology.

In this manner, a long term frequency of the output clock signal 403(0) is constant at a fixed ratio to the input clock signal 411. The value to be added or subtracted at the output phase fractional counter 726(0) is linked to the number of stages needed for a 360 degree phase to ensure constant long term frequency operation. For example, referring back to the example of FIG. 6, the output phase fractional counter 726(0) is configured to count a shift of 1.0 ns every other cycle to achieve a long term frequency of 95.2 MHz (or 10.5 ns/cycle).

A method for the update device 408(0) is further discussed below with reference to FIG. 10.

Calibrator Device

Figure 8:
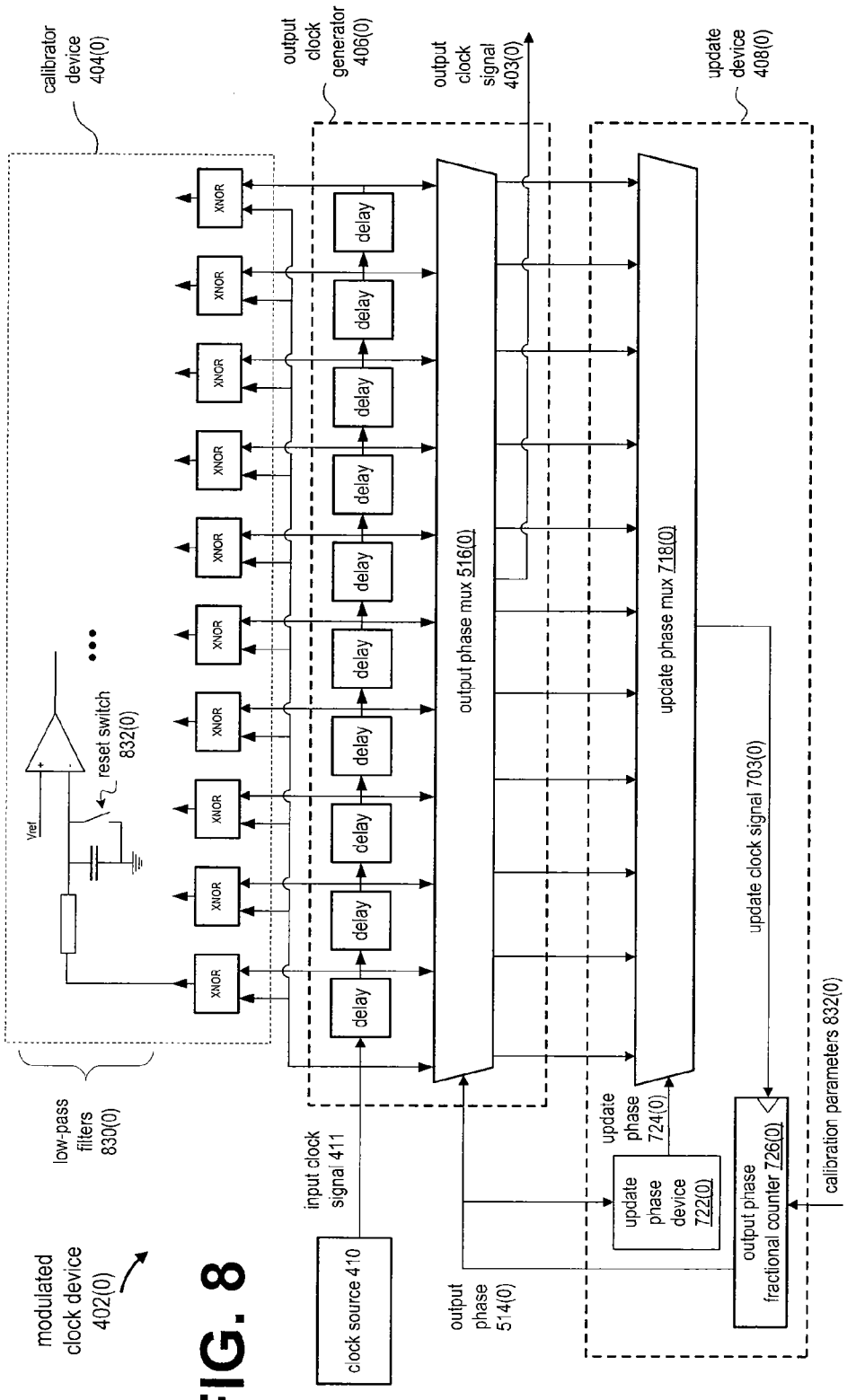
FIG. 8 is a more detailed block diagram of the modulated clock device of FIG. 4, according to one embodiment of the present invention.

FIG. 8 is a more detailed block diagram of the modulated clock device 402(0) of FIG. 4, according to one embodiment of the present invention. A purpose of the calibrator device 404(0) is to detect the location of the 360 degrees phase (or zero-degree phase) of the input clock signal 411. The precise location of the 360-degree phase can change depending on the frequency of the input clock signal 411 and variations of process, voltage, and temperature (PVT) of the modulated clock device 402(0).

The calibrator device 404(0) is coupled to the clock source 410. In this example, the calibrator device 404(0) includes a sequence of XNOR gates and a sequence of low-pass filter 830(0). Each XNOR gate is configured to receive the input clock signal 411 and one of the phases of the input clock signal 411. For example, a first XNOR gate receives the input clock signal 411 and the input clock signal at a 36 degrees phase. A second XNOR gate receives the input clock signal 411 and the input clock signal at a 72 degrees phase. A third XNOR gate receives the input clock signal 411 and the input clock signal at a 108 degrees phase. A fourth XNOR gate receives the input clock signal 411 and the input clock signal at a 144 degrees phase. A fifth XNOR gate receives the input clock signal 411 and the input clock signal at a 180 degrees phase. A sixth XNOR gate receives the input clock signal 411 and the input clock signal at a 216 degrees phase. A seventh XNOR gate receives the input clock signal 411 and the input clock signal at a 252 degrees phase. A eighth XNOR gate receives the input clock signal 411 and the input clock signal at a 288 degrees phase. A ninth XNOR gate receives the input clock signal 411 and the input clock signal at a 324 degrees phase. A tenth XNOR gate receives the input clock signal 411 and the input clock signal at a 360 degrees phase.

In the example of FIG. 8, an output of each XNOR gate is coupled to one of the low-pass filters 830(0), for a total of 10 low-pass filters. Only one low-pass filter is illustrated in FIG. 8 for the sake of simplicity. Each XNOR gate operates as a comparator for the input clock signal 411 and the particular phase of the input clock signal 411 received at each XNOR gate. Each XNOR gate outputs a high (e.g., 1) if both the input clock signal 411 and the particular phase of the input clock signal 411 are the substantially same (e.g., if both inputs are 1, or if both inputs are 0). Each XNOR gate outputs a low (e.g., 0) if one but not both inputs are high (e.g., if one input is 1 while the other input is 0).

Since the sequence of delay circuits is of limited length (e.g., 10 delays in FIG. 8), the tap-off point for the output clock signal 403(0) must recycle at some point. This recycling must take place for both speeding up and slowing down the output clock signal 403(0). To make this recycling happen, the calibrator device 404(0) is configured to detect the particular delay at which the input clock signal 411 has been delayed by a phase of 360 degrees (or an integer factor of 360 degrees). Since the delays are highly variable based on PVT, the calibrator device 404(0) is configured to calculate and update the location of the 360 degrees phase continuously, otherwise severe jitter can occur. Jitter is an undesired deviation from the true periodicity of the input clock signal 411. When the 360 degree point changes, the calibrator device 404(0) ensures smooth operation by making the change effective when the current tap-off point is not close to the 360 degree point.

Each low-pass filter is configured to flip to active high when the input clock signal 411 and the particular delayed clock signal has been substantially equal for a long enough time. At a beginning of each measurement, the reset switch 832(0) is closed to discharge the capacitor of the low-pass filter. The measurement time should be determined such that a threshold is crossed only for a maximum of 2 tap-off points. It may be necessary to vary this measurement time dynamically (e.g., while the modulated clock device 402(0) is in operation).

A method for the calibrator device 404(0) is further discussed below with reference to FIG. 11.

Methods Overview

Figure 9:
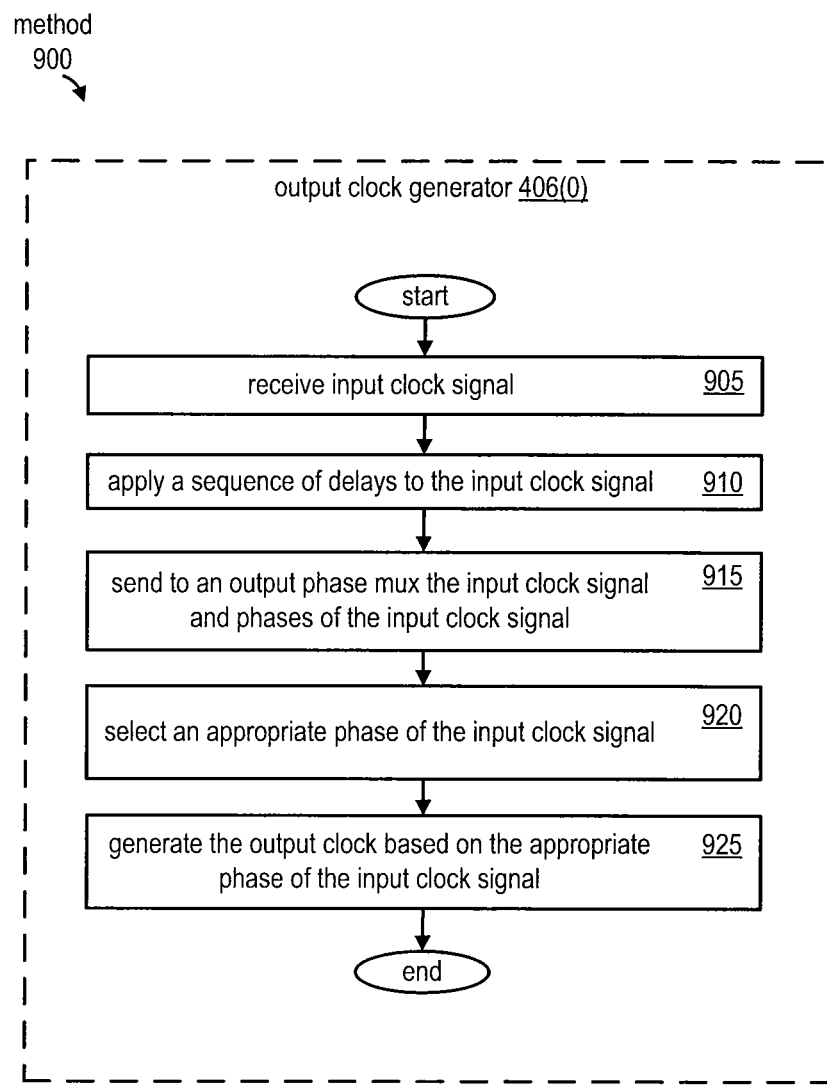
FIG. 9 is a flowchart of a method steps for generating an output clock signal, according to one embodiment of the present invention.

FIG. 9 is a flowchart of method steps for generating an output clock signal, according to one embodiment of the present invention. Although the method steps are described in conjunction with the output clock generator 406(0), persons skilled in the art will understand that any system configured to implement the method steps, in any order, falls within the scope of the present invention.

As shown, a method 900 begins with an action 905, where the output clock generator 406(0) receives an input clock signal from a clock source. In an action 910, the output clock generator 406(0) applies a sequence of delays to the input clock signal to generate one or more delayed phases of the input clock signal. In an action 915, the output clock generator 406(0) sends to an output phase mux the input clock signal and the one or more phases of the input clock signal. In an action 920, the output clock generator 406(0) selects an appropriate phase of the input clock signal from among the input clock signal and the one or more delayed phases of the input clock signal. In an action 925, the output clock generator 406(0) generates an output clock signal based on the appropriate phase of the input clock signal. The method 1000 can then return to step 1005 and continue.

Figure 10:
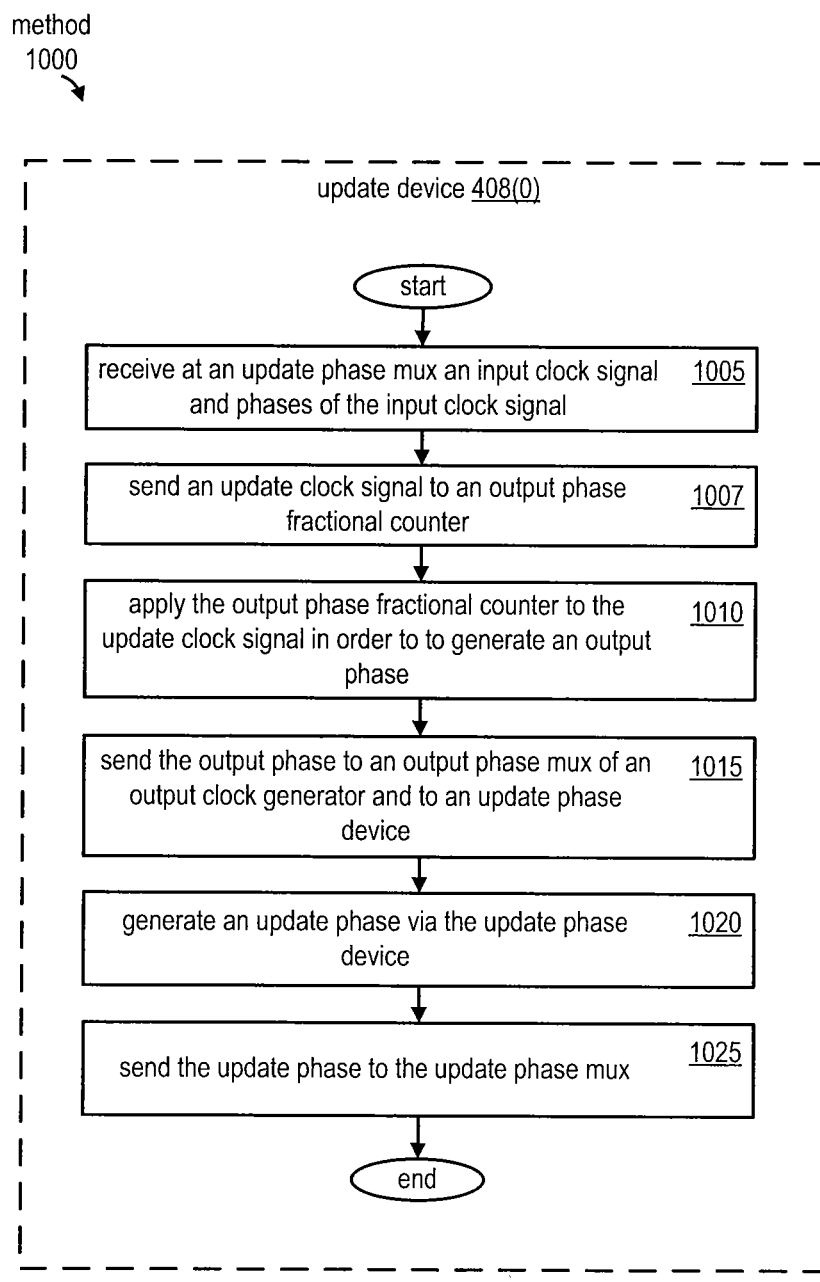
FIG. 10 is a flowchart of method steps for updating a phase of an output clock signal, according to one embodiment of the present invention.

FIG. 10 is a flowchart of method steps for updating a phase of an output clock signal, according to one embodiment of the present invention. Although the method steps are described in conjunction with the update device 408(0), persons skilled in the art will understand that any system configured to implement the method steps, in any order, falls within the scope of the present invention.

As shown, a method 1000 begins with an action 1005, where the update device 408(0) receives at an update phase mux an input clock signal and one or more delayed phases of the input clock signal. In an action 1007, the update phase mux sends an update clock signal to an output phase fractional counter. In an action 1010, the update device 408(0) applies the output phase fractional counter to generate an output phase. In an action 1015, the update device 408(0) sends the output phase to an output phase mux of an output clock generator and to an update phase device. In an action 1020, the update device 408(0) generates an update phase via the update phase device. In an action 1025, the update device 408(0) sends the update phase to the update phase mux. The method 1000 can then return to step 1005 and continue.

Figure 11:
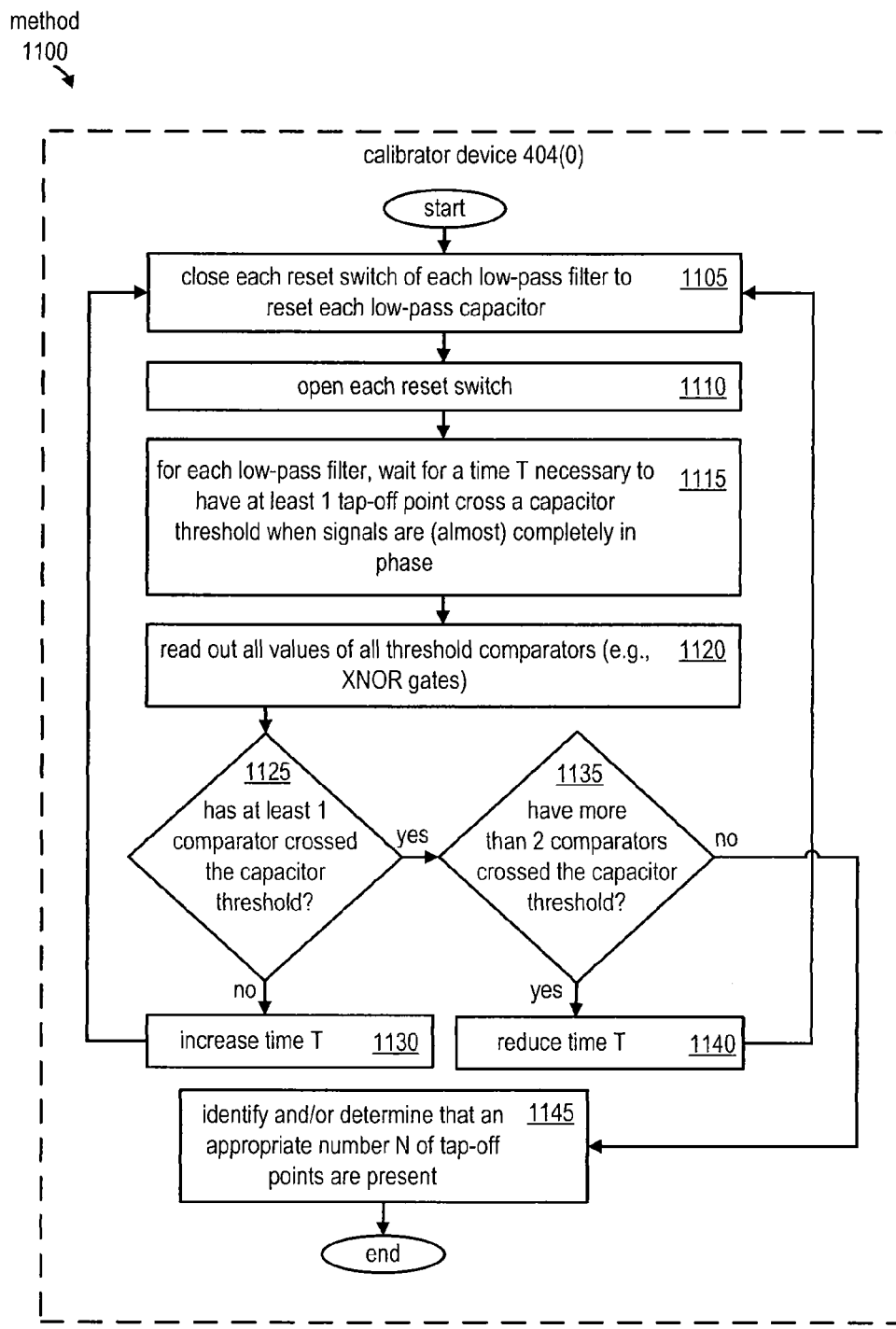
FIG. 11 is a flowchart of method steps for automatically calibrating a modulated clock device, according to one embodiment of the present invention.

FIG. 11 is a flowchart of method steps for automatically calibrating a modulated clock device, according to one embodiment of the present invention. Although the method steps are described in conjunction with the calibrator device 404(0), persons skilled in the art will understand that any system configured to implement the method steps, in any order, falls within the scope of the present invention.

As shown, a method 1100 begins with an action 1105, where the calibrator device 404(0) closes each reset switch of each low-pass filter to reset (e.g., short) each low-pass capacitor. In an action 1110, the calibrator device 404(0) opens each reset switch. In an action 1115, for each low-pass filter, the calibrator device 404(0) waits for a time T necessary such that at least 1 tap-off point (e.g., XNOR gate) causes a capacitor threshold to be crossed when signals are (almost) completely in phase. In an action 1120, the calibrator device 404(0) reads out values received from all threshold comparators (e.g., XNOR gates). In a decision operation 1125, the calibrator device 404(0) determines if at least 1 comparator crossed the capacitor threshold. If not, then the calibrator device 404(0) increases the time T in an action 1130, and then returns to the action 1105. However, if at least 1 comparator has crossed the capacitor threshold, then the calibrator device 404(0) moves to a decision operation 1135 where the calibrator device 404(0) determines if more than 2 comparators crossed the capacitor threshold. If yes, then the calibrator device 404(0) reduces the time T in an action 1140 and then returns to the action 1105. However, if more than 2 comparators have not crossed the capacitor threshold (e.g., only 1 or 2 comparators have crossed the capacitor threshold), then the calibrator device 404(0) moves to an action 1145 where the calibrator device 404(0) identifies and/or determines that an appropriate number N of tap-off points are present. Accordingly, the calibrator device 404(0) can inform the output phase fractional counter 726(0), or another device of the modulated clock device 402(0), that the appropriate number N is either present or not present.

These methods of FIGS. 9-11 may include other actions and/or details that are not discussed in this method overview. Other actions and/or details are discussed with reference to other figures and may be a part of these methods, depending on the implementation. For example, referring back to FIG. 8, if the calibrator device 404(0) determines the appropriate number N is different than a previous appropriate number N, then the calibrator device 404(0) sends updated calibration parameters 832(0) to the output phase fractional counter that reflect this new reality (e.g., the new appropriate number N). Further, the calibration parameters 832(0) may also include a target frequency for the output clock signal 403(0); the modulated clock device 402(0) is configured to attempt to generate the target frequency by coordinating operations of the output clock generator 406(0), the update device 408(0), and the calibrator device 404(0).

Note the calibrator device 404(0) can operate in parallel with the output clock generator 406(0) because the comparators (e.g., XNOR gates) do not directly affect the output clock signal 403(0). The calibrator device 404(0) can operate at limited intervals or continuously, depending on how fast one expects PVT conditions to change. If PVT conditions are known to change very slowly, then the calibrator device 404(0) can be configured with, for example, just one phase and one threshold detector (e.g., one XNOR gate, one low-pass filter, and a mux to select the phase); the calibrator device 404(0) can then measure the optimal phase sequentially (e.g., for the first tap-off point, then for second tap-off point, then for third tap-off point, etc.). Such a reduction saves space (e.g., silicon area) because there is only one low-pass filter and one XNOR gate. Alternatively, where the specifications of the delay elements are known and guaranteed to be substantially constant (e.g., if the delay elements are substantially constant in light of PVT conditions) then the calibrator device 404(0) may not be necessary. Such a reliable state may occur, for example, if the clock source (e.g., PLL device) is configured to generate different phases of one clock signal automatically.

Advantageously, the modulated clock system of the present technology can generate an output clock signal that is slightly faster or slightly slower than an existing source clock, and do so without the need for an extra PLL for each device that requires a slightly different clock frequency.

The invention has been described above with reference to specific implementations. Persons skilled in the art, however, will understand that various modifications and changes may be made thereto without departing from the broader spirit and scope of the invention as set forth in the appended claims. The foregoing description and drawings are, accordingly, to be regarded in an illustrative rather than a restrictive sense.

The invention claimed is:

1. A modulated clock device comprising an update device for updating a phase of the modulated clock device, the update device including:
   an update phase multiplexer coupled to an output phase multiplexer of an output clock generator and configured to receive an input clock signal and one or more phases of the input clock signal;
   an output phase fractional counter coupled to the update phase multiplexer and configured to receive an update clock signal and to generate an output phase.

2. The modulated clock device of claim 1, wherein an update phase multiplexer is configured to shift an update phase from the output phase such that an edge of the update clock signal falls in between a negative edge and a positive edge of an output clock signal generated by the output phase multiplexer.

3. The modulated clock device of claim 1, wherein the output phase fractional counter comprises an accumulator modulo of a number of active taps of the input clock signal.

4. The modulated clock device of claim 1, wherein output phase fractional counter comprises a subtractor modulo of a number of active taps of the input clock signal.

5. The modulated clock device of claim 1, further comprising a calibrator device that includes a sequence of comparators, wherein each comparator is configured to receive the input clock signal and a different delayed phase of the input clock signal at a tap-off point associated with a different delay device included in a sequence of delay devices.

6. The modulated clock device of claim 5, wherein the calibrator device further includes a sequence of low-pass filters configured to determine an appropriate number of tap-off points for the sequence of delay devices.

7. The modulated clock device of claim 6, wherein the sequence of low-pass filters are further configured to read values received from the sequence of comparators to determine when at least one comparator crosses a capacitor threshold and to determine when no more than two comparators have crossed the capacitor threshold.

8. The modulated clock device of claim 5, wherein the calibrator device is configured to determine when the current appropriate number of tap-off points is different than a previously determined appropriate number of tap-off points and to send updated calibration parameters, including the current appropriate number of tap-off points, to the output phase fractional counter.

9. The modulated clock device of claim 5, wherein the calibrator device is configured to operate in parallel with the output clock generator.

10. The modulated clock device of claim 5, wherein the calibrator device operates at limited intervals.

11. The modulated clock device of claim 5, wherein the calibrator device operates continuously.

12. A computer-implemented method for updating a phase of the modulated clock device, the method comprising:
receiving at an update phase multiplexer an input clock signal and one or more phases of an input clock signal;
sending from the update phase multiplexer an update clock signal to an output phase fractional counter configured to generate an output phase;
sending the output phase to an output phase multiplexer.

13. The method of claim 12, wherein the method further comprises shifting an update phase from the output phase to cause an edge of the update clock signal to substantially fall in between a negative edge and a positive edge of the output clock signal.

14. The method of claim 12, wherein the method further comprises sending the input clock signal and one or more delayed phases of the input clock signal to a calibrator device including a sequence of comparators, wherein each comparator is configured to receive the input clock signal and a different delayed phase of the input clock signal at a tap-off point associated with a different delay device included in a sequence of delay devices.

15. The method of claim 14, further comprising determining an appropriate number of tap-off points for the sequence of delay devices.

16. The method of claim 15, wherein determining an appropriate number of tap-off points comprises:
reading values received from the sequence of comparators;
determining at least one comparator crossed a capacitor threshold; and
determining no more than 2 comparators crossed a capacitor threshold.

17. The method of claim 15, wherein the method further comprises:
determining when the current appropriate number of tap-off points is different than a previously determined appropriate number of tap-off points; and
sending updated calibration parameters, including the current appropriate number of tap-off points, to the output phase fractional counter.

18. A computing device, comprising:
one or more electronic components; and
a modulated clock system configured to deliver one or more output clock signals to the one or more electronic components by using one or more modulated clock devices, wherein at least one modulated clock device includes an update device having:
an update phase multiplexer coupled to an output phase multiplexer of an output clock generator and configured to receive an input clock signal and one or more phases of the input clock signal,
an output phase fractional counter coupled to the update phase multiplexer and configured to receive an update clock signal and to generate an output phase, and
an update phase device coupled to the output phase fractional counter and to the update phase multiplexer,
wherein the output phase fractional counter is further configured to send the output phase to the output phase multiplexer and to the update phase device,
wherein the update phase device is further configured to generate an update phase and to send the update phase to the update phase multiplexer.

19. The computing device of claim 18, wherein the update phase multiplexer is configured to shift the update phase from the output phase in such a way that an edge of the update clock signal substantially always falls in between a negative edge and a positive edge of an output clock signal generated by the output phase multiplexer.

20. The computing device of claim 18, wherein at least one modulated clock device further includes a calibrator device including a sequence of comparators configured to receive the input clock signal and one or more delayed phases of the input clock signal, wherein each comparator of the sequence of comparators is configured to receive the input clock signal and one delayed phase at a tap-off point of one delay device.

* * * * *